United States Patent [19]
Honnigford

[11] Patent Number: 5,530,388
[45] Date of Patent: *Jun. 25, 1996

[54] PARABOLIC CURRENT GENERATOR FOR USE WITH A LOW NOISE COMMUNICATION BUS DRIVER

[75] Inventor: Edward H. Honnigford, Russiaville, Ind.

[73] Assignee: Delco Electronics Corporation, Kokomo, Ind.

[*] Notice: The term of this patent shall not extend beyond the expiration date of Pat. No. 5,164,611.

[21] Appl. No.: 409,249

[22] Filed: Mar. 24, 1995

[51] Int. Cl.$^6$ .................................... H03K 4/04
[52] U.S. Cl. .................. 327/125; 327/170; 327/543; 327/546
[58] Field of Search .................... 327/538, 541, 327/543, 546, 561, 108, 345, 566, 170, 350, 125; 323/312, 316

[56] References Cited

U.S. PATENT DOCUMENTS

| | | | |
|---|---|---|---|
| 4,055,774 | 10/1977 | Ahmed | 327/538 |
| 4,100,436 | 7/1978 | van de Plassche | 327/538 |
| 5,061,862 | 10/1991 | Tamagawa | 327/541 |
| 5,164,611 | 11/1992 | Summe | 307/261 |
| 5,180,988 | 1/1993 | McDaniel | 327/543 |
| 5,373,226 | 12/1994 | Kimura | 327/541 |

Primary Examiner—Timothy P. Callahan
Assistant Examiner—My-Trang Nu Ton
Attorney, Agent, or Firm—Jimmy L. Funke

[57] ABSTRACT

A parabolic current generator is provided for use with a waveshaping circuit for producing a sinusoidally increasing bus output voltage signal in response to the rising edge of a data input signal, and a sinusoidally decreasing bus output voltage signal in response to a falling edge of the data input signal. The parabolic current generator provides a current that increases parabolically in response to the rising or falling edge of the data input signal and that decreases parabolically when the bus output voltage signal reaches one-half of its intended full voltage swing or falls below one-half of the full voltage swing to respectively produce the sinusoidally increasing and decreasing voltage at the bus output. The parabolic current generator includes an operational amplifier having an integrating capacitor connected between its non-inverting input and its output. A field effect transistor is connected to its inverting input and has an impedance sized to minimize the capacitor value.

7 Claims, 6 Drawing Sheets

PARABOLIC CURRENT GENERATOR FOR USE WITH A LOW NOISE COMMUNICATION BUS DRIVER

FIELD OF THE INVENTION

This invention relates in general to pulse shaping circuitry and more specifically to a parabolic current generator for use with low noise communication bus driver circuitry.

BACKGROUND OF THE INVENTION

A number of serial data bus driving circuits have been developed which eliminate high frequency noise components associated with the substantially instantaneous rise and fall times of the leading and trailing edges of the logic signals without distorting the data contained in the logic signals. One such wave shaping circuit is disclosed in U.S. Pat. No. 5,164,611 to Summe, which is assigned to the assignee of the present invention and is hereinafter incorporated by reference. The Summe patent discloses a wave shaping circuit that generates a relatively small amount of noise in the AM broadcasting band, is insensitive to ground offsets, and which operates with a minimal propagation delay between input logic signals and communication bus signals.

The Summe patent utilizes an exponential current source to provide a current to a regulator bus driver which charges and discharges a capacitor in response to the rising or falling edge of the data input signal. The exponential current source 26 is shown in FIG. 1 and includes a pair of NMOS transistors 22 and 24 which function as current sources. The NMOS transistor 12 is connected in series with and controls current source 22, which provides 95 microamps of current. Current source 24, which provides 5 microamps of current, is connected in parallel with the series connected transistor 12 and current source 22. PMOS transistor 44 is connected in series with the parallel combination of transistor 24 and series connected transistors 12 and 22, and forms a current mirror 40 with PMOS transistor 42. Current flowing through transistor 44 is thus mirrored to transistor 42 which provides this current through diode stack 30. Diode stack 30 includes diode connected NPN transistors 32–38 which are connected between the transistor 42 and ground. A two stage operational amplifier 46 comprises a first stage including differential input NPN transistors 48 and 50, PMOS load transistors 56 and 58, and current source 52. The second stage includes PMOS drive transistor 66 and current source 64. An integrating capacitor 60 and a zero cancelling resistor 62 are connected between the collector of transistor 50 and the base of transistor 48.

A linear to exponential converter 67 comprises a transistor 68 and a diode stack 70 which includes diode connected NPN transistors 72–76. The transistor 68 converts the linearly changing voltage designated VB, at its base, to an exponentially changing current at its collector according to the relationship $$I = I_s^* \exp(VB/4V_t) \tag{1}$$

where I is the current flow through the collector of transistor 68, $I_s$ is the saturation current of the transistor 68 which is constant for a given process, VB is voltage at node VB and $V_t$ is the thermal voltage which is a constant at a given temperature. A current mirror 78, comprising PMOS transistors 80 and 82, is connected with the collector of transistor 68 so that the transistor 68 collector current is reflected through PMOS transistor 84 to create a bias reference voltage EXPBIAS 86.

With reference to the waveforms 95 of FIG. 2, the exponential current source 26 operates in the following manner. A LOW logic input signal (signal 2A) at the gate of transistor 12 causes 5 microamps of current to flow through diode stack 30, thereby creating a reference voltage at node VA according to the relationship $$VA = 4V_t \ln \frac{(I_m)}{I_s} \tag{2}$$

where $V_t$ and $I_s$ are constants for a given process as previously discussed, and $I_m$ (signal 2B) is the current mirrored through the diode stack 30 from current mirror 40. In the steady state, the node voltage VA (signal 2C) is reflected to node VB (signal 2D), which is then converted back into a current by the linear to exponential converter 67.

When the logic input voltage at the gate of transistor 12 goes HIGH, the transistor 12 turns on and the current sourced from transistor 44 becomes the sum of the currents sunk by transistors 22 and 24, which totals 100 microamps. This current $I_m$ is mirrored through the diode stack 30 which causes an instantaneous increase in the node voltage VA. In accordance with equation (2), this increase is proportional to the logarithm of the current $I_m$. Node VB attempts to follow node VA but is limited by the current through transistor 52, and by capacitor 60 according to the following relationship:

$$\frac{dVB}{dt} = \frac{I_{52}}{C} \tag{3}$$

such that node VB rises at a fixed linear rate. Node voltage VB is impressed upon the base of transistor 68 which translates the linear voltage change to an exponential current through transistor 82 as previously discussed. With respect to equation (1) (signal 2E). This exponential current is then mirrored to transistor 80 to create the bias reference voltage EXPBIAS.

When the logic input voltage at the gate of transistor 12 goes LOW, the transistor 12 turns off and the current sourced from transistor 44 is again the current sunk only by transistor 24, which is 5 microamps. This current $I_m$ is then mirrored through the diode stack 30 which causes an immediate decrease in the node voltage VA in accordance with equation (2). Again, node VB tries to follow node VA but is limited by equation (3) above. Node voltage VB therefore decreases at a fixed linear rate which then results in an exponentially decreasing current through transistor 82 in accordance with equation (1). This current is then mirrored to transistor 80 to create the bias reference voltage EXPBIAS. In this manner, the exponential current source 26 provides an exponentially increasing output current in response to a HIGH logic level at the gate of transistor 12, and provides an exponentially decreasing output current in response to a LOW logic level at the gate of transistor 12.

The exponential current source 26 unfortunately includes some inherent disadvantages. First, due to the low impedance of the NPN diode string 30, the change in the node voltage VA is small when the current through current mirror 40 steps back and forth between 5 microamps and 100 microamps. This is evidenced by equation (2) which indicates that the node voltage increase and decreases only logarithmically with respect to the correspondingly increasing and decreasing current $I_m$. Since node VB ultimately attempts to track node VA, equation (3) therefore requires capacitor 60 to have a relatively large value in order to obtain a desirable dt given a fixed current $I_{52}$. Secondly, the diode stacks 30 and 70 require 8 NPN transistors. When fabricating exponential current source 26 on a monolithic integrated circuit, great area savings could be realized if capacitor 60 could be significantly reduced in size, and the diode stacks 30 and 70 could be replaced with more area efficient circuit components.

SUMMARY OF THE INVENTION

The present invention overcomes the foregoing disadvantages of the prior art by providing an area efficient parabolic current generator. In accordance with one aspect of the present invention, a current generator comprises an operational amplifier having an inverting input, a non-inverting input and an output and a first field effect transistor having a gate, a drain and a source. The gate and drain of the first transistor are connected to the inverting operational amplifier input and to a source of alternatingly high and low input current. The drain and source of the first transistor define an impedance therebetween. The first transistor establishes a voltage level at the inverting operational amplifier input proportional to the flow of current from the input current source through the impedance. A capacitor is connected between the non-inverting operational amplifier input and the output which has a value inversely proportional to the difference in voltage levels at the inverting input corresponding to the difference between the high and low input currents flowing through the impedance. The impedance is sized to maximize the difference in voltage levels at the inverting input to thereby minimize the capacitor value.

In accordance with another aspect of the present invention, a current generator comprises a first circuit responsive to a high level input current to provide a linearly increasing voltage, and to a low level input current to provide a linearly decreasing voltage, a second circuit responsive to the linearly increasing voltage to provide a parabolically increasing output current, and to the linearly decreasing voltage to provide a parabolically decreasing output current, whereby the current generator is responsive to the high level input current to produce a parabolically increasing output current, and to the low level input current to produce a parabolically decreasing output current.

In accordance with a further aspect of the present invention, a waveshaping circuit for producing a bus output voltage signal having a substantially sinusoidal rising transition from a low voltage level to a high voltage level in response to the rising edge of a data input signal, and a substantially sinusoidal falling transition from the high voltage level to the low voltage level, in response to the falling edge of the data input signal, comprises integrator means providing the bus output voltage signal, parabolic current generator means providing a parabolically increasing output current to the integrator means in response to a rising or falling edge of the data input signal, and providing a parabolically decreasing output current to the integrator means in response to the bus output voltage dropping below the predetermined value while the data input is low.

In accordance with yet another aspect of the present invention, a waveshaping circuit for producing a bus output voltage signal which is insensitive to ground offset between a plurality of nodes of a communications bus comprises current generator means for generating a parabolic current, integrator means, means coupling the integrator means to the communications bus, and bus driver means responsive to a data input signal for supplying the parabolic current to the integrator means, whereby the parabolic current is converted to a voltage on the communications bus.

One object of the present invention is to provide an area efficient parabolic current generator for use with a low noise communication bus driver.

Another object of the present invention is to provide a parabolic current generator incorporating an integrating capacitor, wherein the capacitor has minimal capacitance.

A further object of the present invention is to provide a waveshaping circuit having a sinusoidally increasing bus output voltage in response to the rising edge of a data input signal, and having a sinusoidally decreasing bus output voltage in response to the falling edge of a data input signal, wherein the waveshaping circuit includes a parabolic current generator.

Yet another object of the present invention is to provide a waveshaping circuit for producing a bus output voltage signal which is insensitive to ground offset voltage differences between circuit ground and bus ground, wherein the waveshaping circuit includes a parabolic current generator.

These and other objects of the present invention will become more apparent from the following description of the preferred embodiment.

DESCRIPTION OF THE PREFERRED EMBODIMENT

Figure 1:
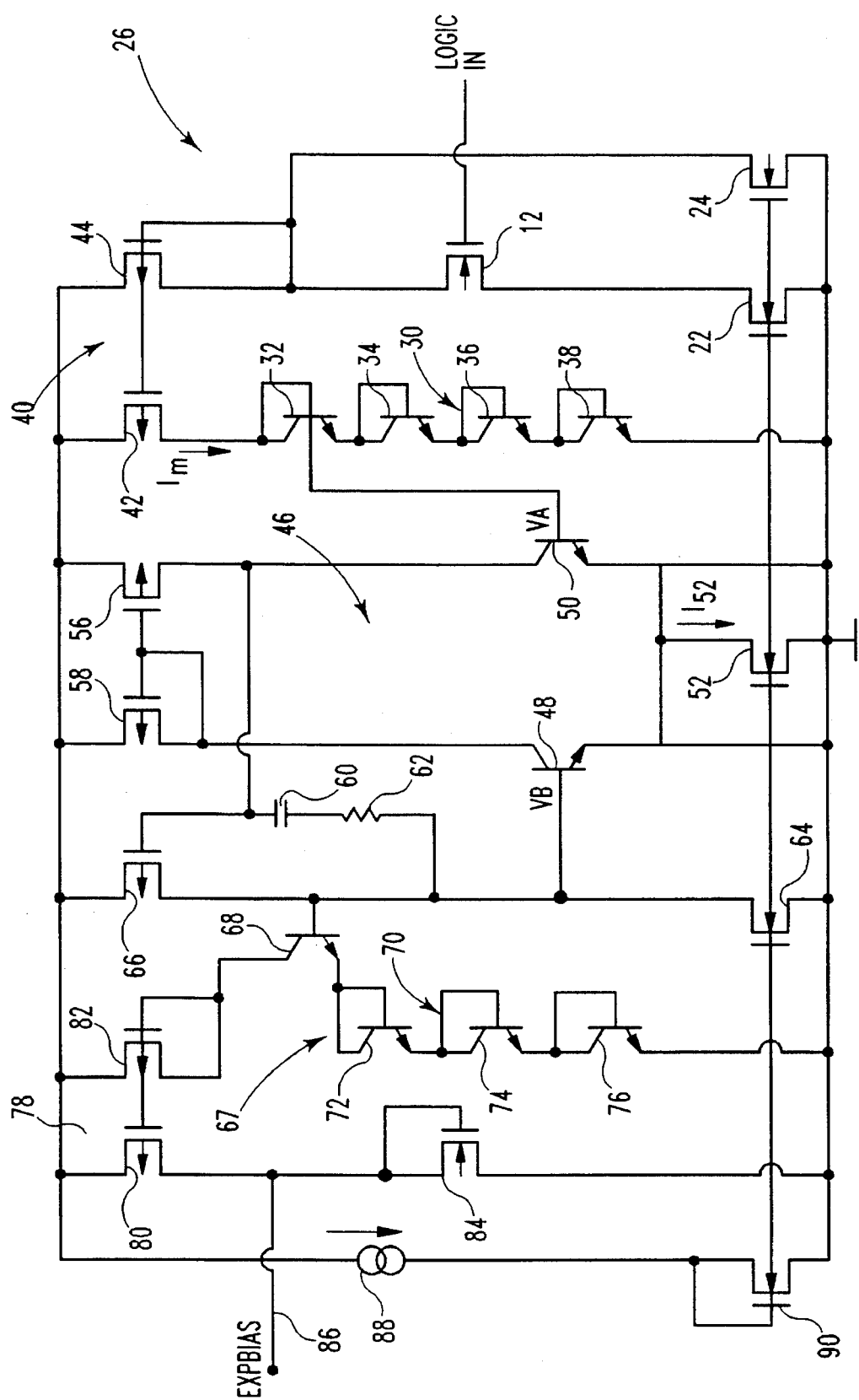
FIG. 1 is a schematic of a prior art exponential current source.
Figure 2:
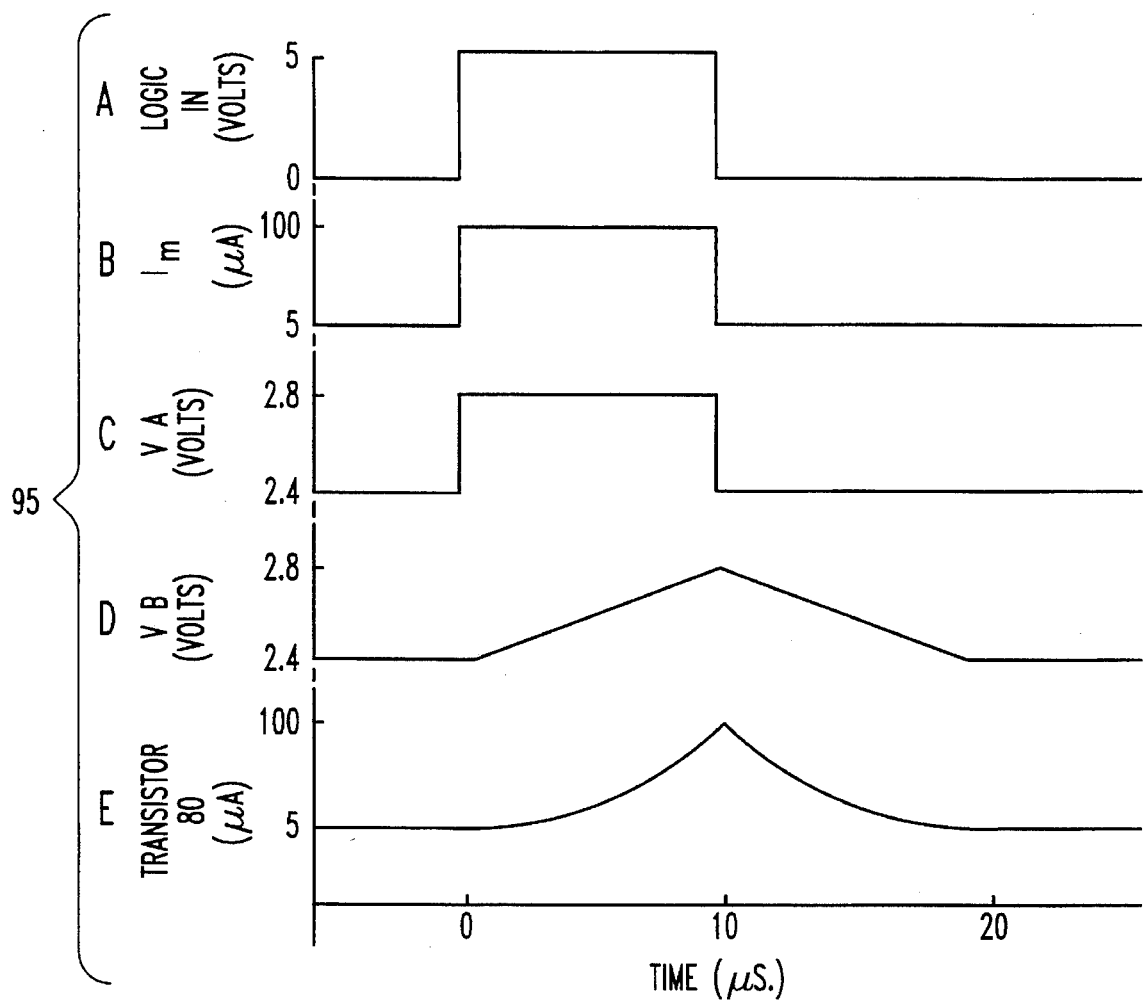
FIG. 2 is a timing and waveform diagram of certain nodes in the prior art exponential current source of FIG. 1.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Figure 3:
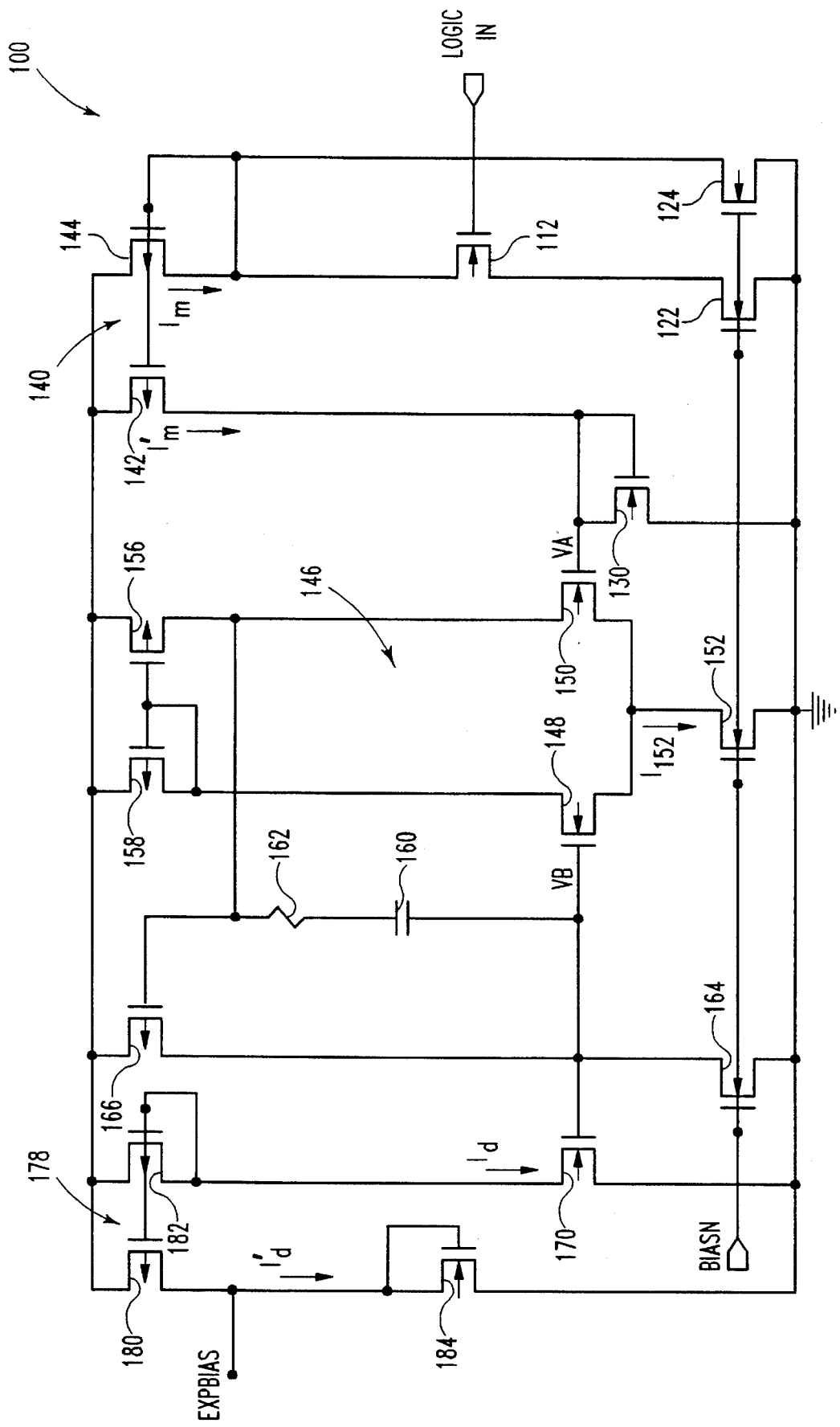
FIG. 3 is a schematic of a parabolic current generator in accordance with the present invention.

Referring now to FIG. 3, a parabolic current generator 100, in accordance with the present invention, is shown. NMOS transistor 112 is connected in series with and controls an NMOS current source 122 which provides, in a preferred embodiment, 58 microamps of current. An NMOS current source 124, which preferably provides 2 microamps of current, is connected in parallel with the series connected transistor 112 and current source 122. PMOS transistor 144 is connected in series with the parallel combination of current source 124 and the series connected transistor 112 and current source 122. PMOS transistor 142 is connected with transistor 144 to form a current mirror 140. NMOS transistor 130 is connected at its gate and drain to transistor 142. The source of transistor 130 is connected to ground.

A two stage operational amplifier 146 comprises a first stage including NMOS differential input transistors 148 and 150, PMOS load transistors 156 and 158, and current source 152. The second stage includes PMOS drive transistor 166 and NMOS current source 164. An integrating capacitor 160 and a zero cancelling resistor 162 are connected between the drain of transistor 150 and the gate of transistor 148. The drain of transistor 150 is further connected to the gate of transistor 166.

A linear to parabolic converter comprises an NMOS transistor 170 connected at its gate to the gate of transistor 148. The transistor 170 converts the linearly changing voltage, designated VB, at its gate, into a parabolically changing current at its drain according to the relationship $$I_d = W m_{ns} C_{ox} (VB - V_t)^2 / 2L \qquad (4)$$

where $I_d$ is the current flowing through the drain of transistor 170, W is the width of the transistor channel, $m_{ns}$ is the surface mobility of electrons in the transistor channel, $C_{ox}$ is the capacitance of the gate oxide, VB is the voltage at the gate of transistor 170, $V_t$ is the threshold voltage for channel inversion to occur, and L is the length of the transistor channel. This square-law relationship is common, at least to a first approximation, to all field effect transistors so that a linearly changing voltage at the gate (node VB) of transistor 170 causes a corresponding parabolically changing current in the drain of transistor 170.

A current mirror 178 comprising PMOS transistors 180 and 182 is connected to the drain of the transistor 170. A bias reference comprising an NMOS transistor 184 converts the current $I_d$ from PMOS transistor 182 into a reference voltage EXPBIAS for biasing other NMOS transistors in the bus driver 28, as discussed hereinafter. A bias voltage BIASN sets up the bias voltages for the current sources 122, 124, 152, and 164, and may be provided as shown with respect to FIG. 1.

The parabolic current source 100 operates in the following manner with reference to the circuit of FIG. 3 and the waveforms 195 of FIG. 4. When the logic IN voltage (signal 4A) is low, transistor 112 is turned off. The current sourced from transistor 144 is therefore limited to the current being sunk by transistor 24, which in a preferred embodiment is 2 microamps. The current in transistor 144 is mirrored to transistor 142 and flows through a resistive channel established between the drain and source of transistor 130. Those skilled in the art will recognize that the impedance of the channel between the drain and source of transistor 130 may be designed to a desired value through appropriate semiconductor doping techniques and dimensioning of the transistor area, corresponding to channel width and length, of transistor 130. In a preferred embodiment, the channel size of transistor 130 is designed to be approximately 6 microns wide by 5 microns long. The voltage drop across the channel impedance of transistor 130, established by the current $I'_m$ (signal 4B) flowing therethrough from current mirror 140, creates a reference voltage at node VA (signal 4C). In the steady state, the voltage at node VA is reflected to node VB (signal 4D) by the operational amplifier 146.

The voltage at node VB is converted back into a current by the linear to parabolic converting transistor 170 as previously described with respect to equation (4). The parabolic current $I_d$ flowing through the drain of transistor 170 is sourced from transistor 182 which is in turn mirrored to transistor 180. The current from transistor 180 (signal 4E) is converted to a bias reference voltage EXPBIAS by transistor 184.

When the logic IN voltage goes high, transistor 112 turns on and the current sourced from transistor 144 ($I_m$) is the sum of the currents sunk by transistors 122 and 124, which totals 60 microamps. $I_m$ is mirrored by transistor 142 (as $I'_m$) into the channel impedance of transistor 130 which causes the voltage at node VA to change immediately to a higher value (signals 4A–4C). An important aspect of the present invention is the increase of the node voltage VA with increasing current $I'_m$ according to the equation $$VA = (2LI'_m / W m_{ns} C_{ox})^{1/2} + V_t \qquad (5)$$

Figure 4:
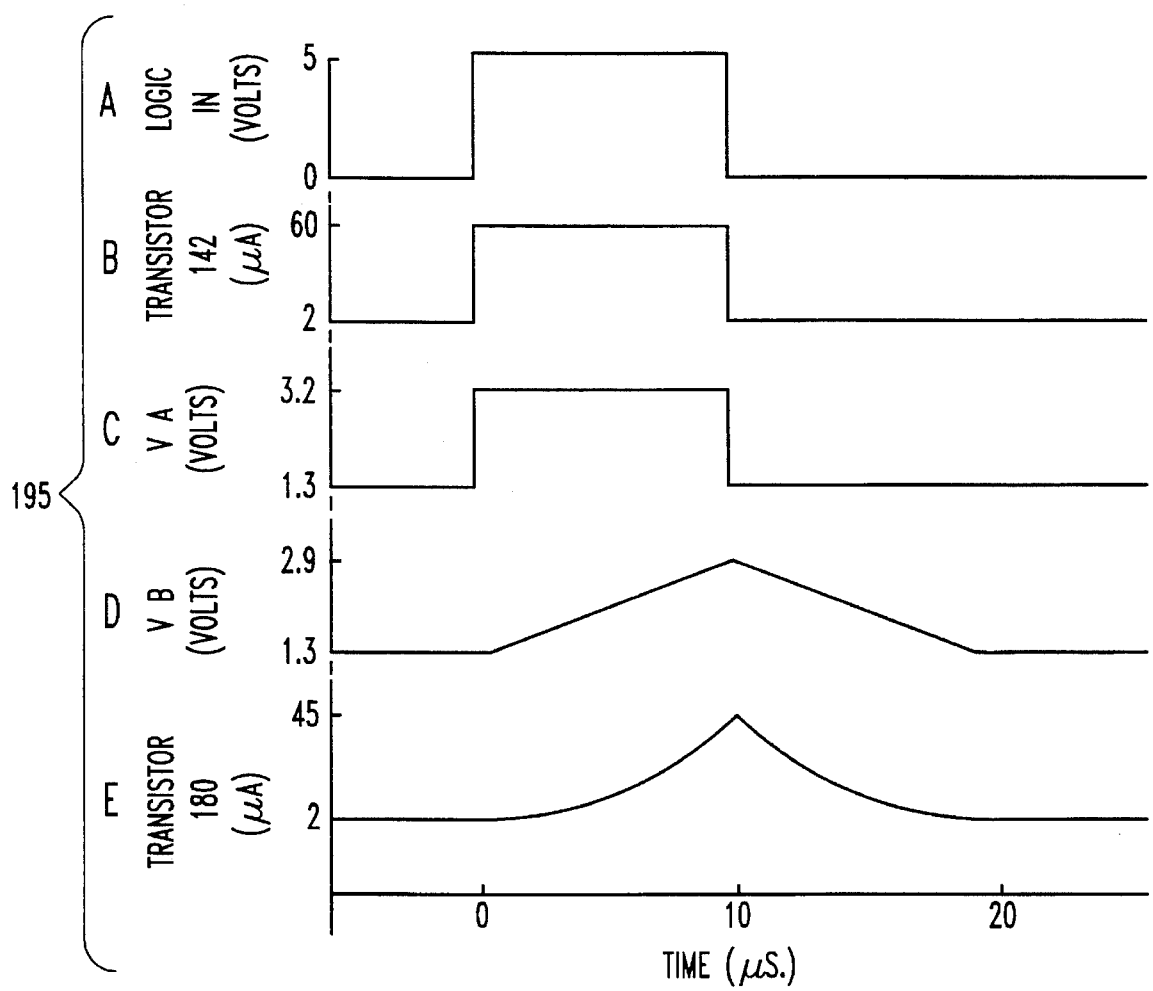
FIG. 4 is a timing and waveform diagram of certain nodes in the parabolic current generator of FIG. 3.

Thus, as compared with the prior art exponential current source 26 of FIG. 1, the current generator 100 of FIG. 4 provides a larger change in VA for a given change in $I'_m$. This feature results in the ability to provide a desired increase in VA given an increase in $I'_m$ by varying the W/L ratio of transistor 130. Unlike the current $I_m$ of the prior art current source 26 of FIG. 1, a maximum increase in $I'_m$ corresponds to a sizable increase in VA which, in this example, is 1.9 volts. The amplifier 146 attempts to change the voltage at node VB to match the voltage at node VA. However, the voltage change at node VB is controlled by the discharging of capacitor 160.

Since node voltage VB is lower than node voltage VA, the transistor 150 conducts all of the current being sunk by transistor 152. The current from transistor 150 is used to discharge capacitor 160. The rate of discharge is controlled by the size of the capacitor 160 and the size of the current source transistor 152 in accordance with equation (3), wherein the current $I_{52}$ is replaced by $I_{152}$. This linearly discharging capacitor creates a linearly increasing voltage at node VB (signal 4D). The linearly increasing voltage at node VB, when applied to the gate of transistor 170, creates a parabolically increasing current $I_d$ in the drain of transistor 170 (signal 4E) in accordance with equation (4). The current $I_d$ from the drain of transistor 170 is mirrored by the current mirror 178 to the transistor 184 (as $I'_d$) to thereby create the bias reference voltage EXPBIAS.

When the logic IN voltage goes low, the transistor 112 turns off and the current sourced from transistor 144 is again limited to the current being sunk by transistor 124, which is, in a preferred embodiment, 2 microamps. The current in transistor 144 ($I_m$) is mirrored to transistor 142 (as $I'_m$) and flows through the channel impedance of transistor 130. According to equation (5), the sudden decrease in $I'_m$ causes the voltage at node VA to immediately decrease to a lower value (signals 4B and 4C). Unlike the current $I_m$ of the prior art current source 26 of FIG. 1, however, this decrease in $I'_m$ corresponds to a sizable decrease in VA which, in this example, is 1.9 volts. The amplifier 146 attempts to change the voltage at node VB to match the voltage at node VA. However, the voltage change at node VB is controlled by the charging of capacitor 160.

Since node voltage VB is higher than node voltage VA, the transistor 148 conducts all of the current being sunk by transistor 152. The current from transistor 148 is sourced from load transistor 158. The current sourced from load transistor 158 is mirrored to load transistor 156. The current from load transistor 156 is used to charge capacitor 160. The rate of charge is controlled by the size of the capacitor 160 and the size of the current source transistor 152 according to equation (3) where, again, $I_{52}$ is replaced by $I_{152}$. This linearly charging capacitor creates a linearly decreasing voltage at node VB. The linearly decreasing voltage of node VB, when applied to the gate of transistor 170, creates a parabolically decreasing current in the drain of transistor 170 as indicated by equation (4). The parabolically decreasing current $I_d$ in the drain of transistor 170 is mirrored by the current mirror 178 to the transistor 184 (as $I'_d$) to create the bias reference voltage EXPBIAS.

The parabolic current generator circuit of FIG. 3, in a preferred embodiment, is intended to be fabricated on a monolithic integrated circuit. Since the reduction of integrated circuit size is a constant goal, an important aspect of the present invention is to provide the current generator of FIG. 3 in an area-efficient manner. In this regard, the channel impedance of transistor 130 is designed to maximize the voltage difference at the node VA when the current $I'_m$ sourced from current mirror 140 steps back and forth between a low input current and a high input current. With a larger voltage change at node VA, the voltage change dVB of equation (3) is correspondingly larger. For a fixed drain current $I_{152}$, a desired dt may therefore be realized with a smaller capacitor 160 than with the capacitor 60 used in the exponential current source 26 of FIG. 1. It has been found through experimentation that the parabolic current generator 100 of FIG. 3 has substantially identical performance characteristics to the exponential current source 26 of FIG. 1, with the advantage that the capacitor 160 is reduced in size by a factor of 10 over the size of capacitor 60. As previously discussed, this is accomplished through appropriate choice and design of the channel impedance of transistor 130. As a second added benefit, the eight large NPN transistors 32–38 and 68–76 of the exponential current generator 26 of FIG. 1 are replaced by two small NMOS transistors 130 and 170 in the parabolic current generator of FIG. 3. Operationally, the parabolic current generator 100 of FIG. 3 is similar enough to provide a direct replacement for exponential current generator 26 in the low noise communication bus driver 200 shown in FIG. 5.

Figure 5:
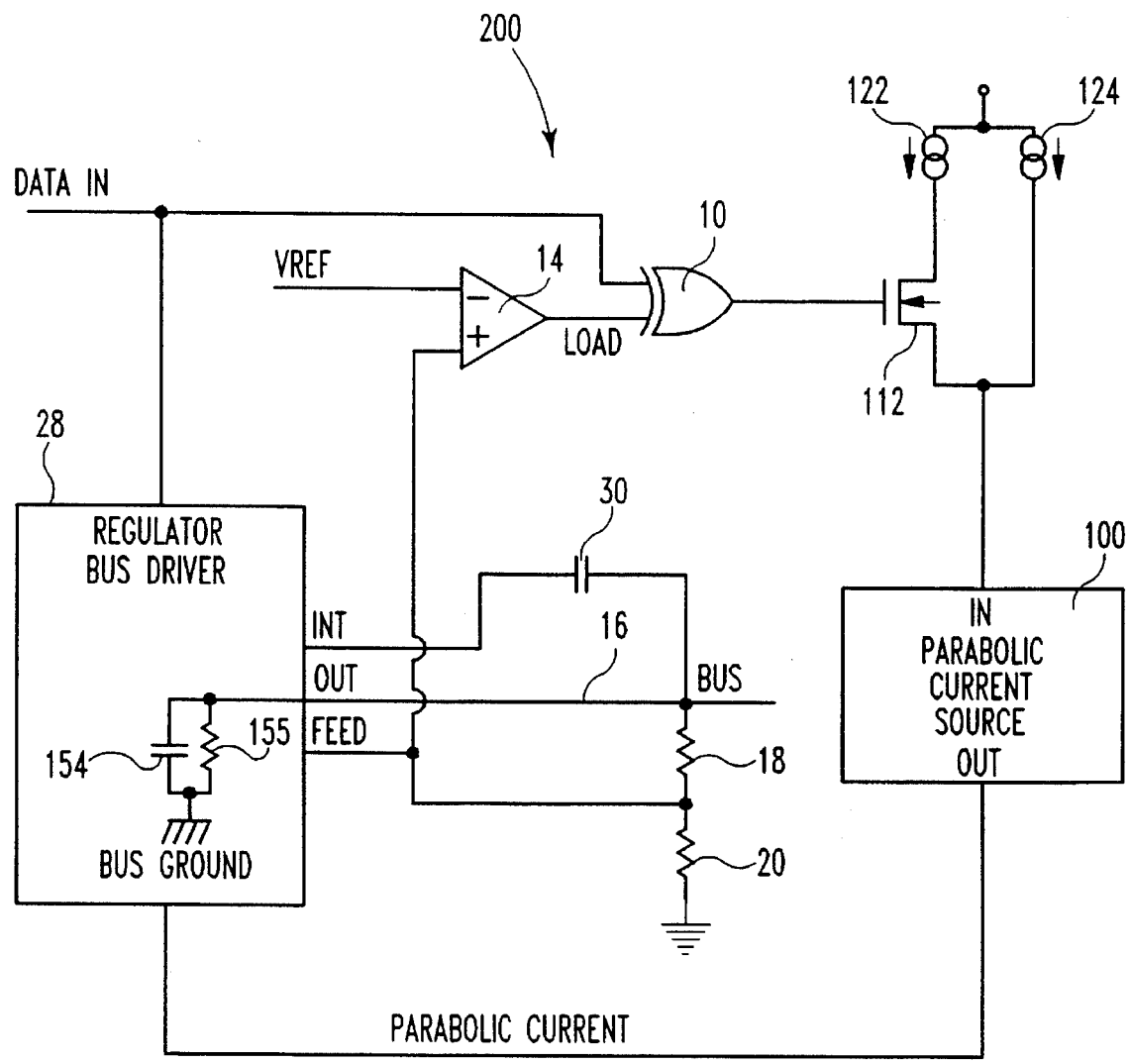
FIG. 5 is a combination block diagram and schematic of a low noise communication bus driver circuit incorporating the parabolic current source of FIG. 3.

Referring now to FIG. 5, a logic level drive signal designated DATAIN is applied as one input to an exclusive OR gate 10 which controls the gate of NMOS transistor 112 of FIG. 3. The other input to the exclusive OR gate 10 is designated LOAD and is obtained from the output of a comparator 14. The comparator 14 switches when the output voltage on the bus 16 reaches ½ of its maximum intended value. The switch point is established by the voltage divider resistors 18 and 20. Transistor 112 is connected to current sources 122 and 124 as previously described with respect to FIG. 3.

The parabolic current source 100 is serially connected with the parallel branches containing the sources 122 and 124 to thereby receive 2 microamps when the transistor 112 is off and 60 microamps when the transistor 112 is on. The parabolic current source 100 supplies current to a regulator/bus driver block 28 which also responds to DATAIN. The driver block 28 integrates the current from the generator 100 via a capacitor 30, and provides an output voltage waveform on the bus 16. The output designated BUS has substantially sinusoidal leading and trailing edges in response to the substantially instantaneous rising and falling edges of the DATAIN logic drive signal as shown in FIG. 6.

Figure 6:
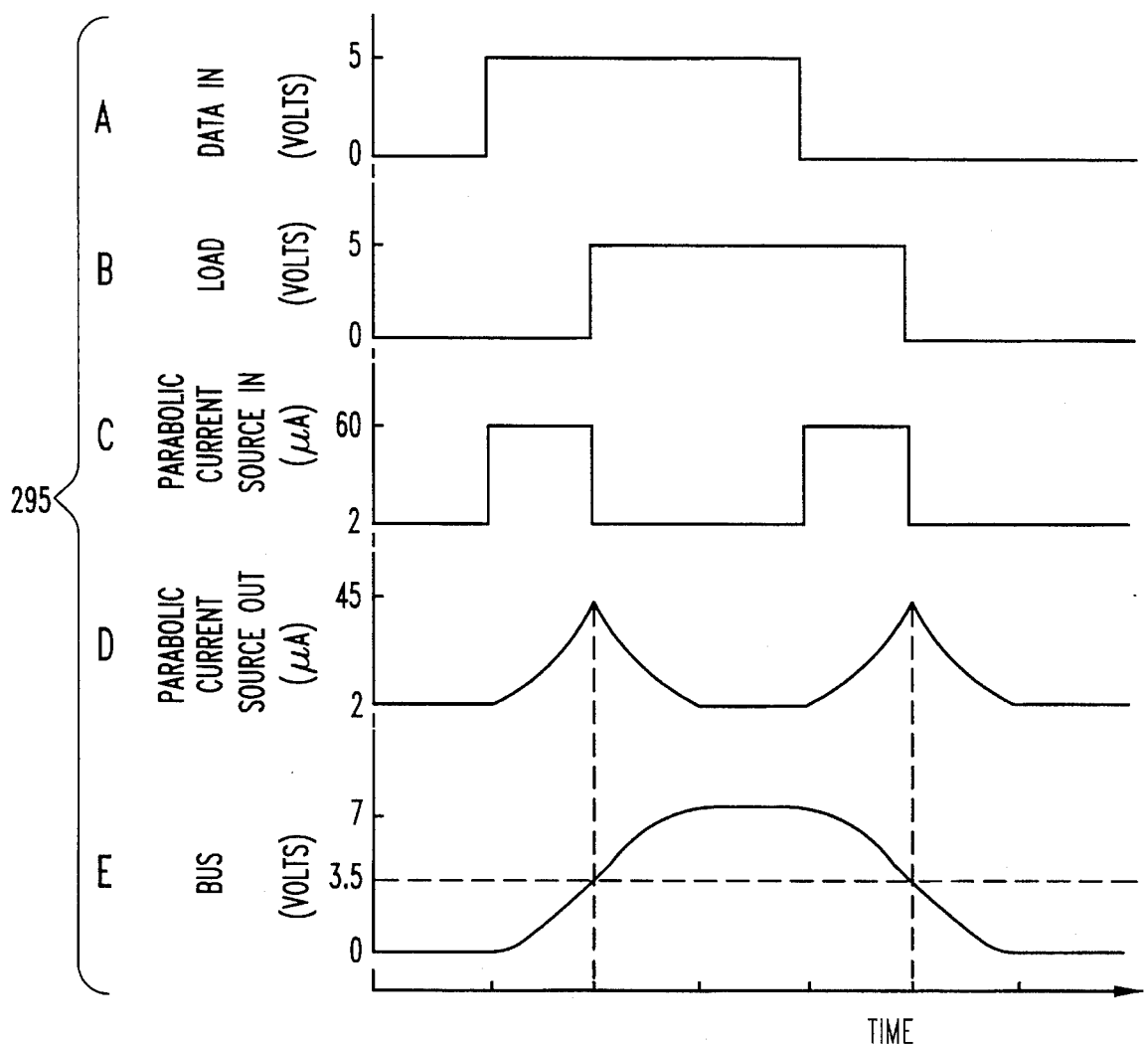
FIG. 6 is a timing and waveform diagram of certain nodes in the bus driver circuit of FIG. 5.

Referring now to the circuitry 200 of FIG. 5 and corresponding waveforms 295 of FIG. 6, the output of the exclusive OR gate 10 goes high, turning on the transistor 112, when DATAIN (signal 6A) switches high while LOAD (signal 6B) is low. Thus, the input to the parabolic current generator 100 (signal 6C, corresponding to the current $I_m$ of FIG. 3) is switched from 2 microamps to 60 microamps and the output of the current generator 100 (signal 6D, corresponding to the current $I'_d$ of FIG. 3) begins to rise parabolically. The current out of the generator 100 is integrated by the capacitor 30 to produce the rising edge of the voltage waveform BUS (signal 6E). When the output of the driver 28 reaches mid-supply, in the example shown 3.5 volts, the output of comparator 14 switches high. With both inputs to the exclusive OR gate 10 being high, the output goes low, turning off transistor 112. The input to the generator 100 drops to 2 microamps and the output of the generator 100 starts to decrease parabolically toward 2 microamps. The integration of the output of the generator 100 continues but at a reduced rate, thereby creating a voltage waveform on BUS which is shaped like a sinusoid. The same shaping occurs on the falling edge of DATAIN, producing a falling edge shaped like a sinusoid. These sinusoidal rising and falling edges generate relatively small amounts of harmonic noise.

The resistor 155 and capacitor 154 connected between the node BUS and a node designated BUS GROUND represent the load presented to the regulator bus driver 28 by the communication bus. The voltage level of BUS GROUND can be +/–2 volts different from the ground reference for the regulator bus driver 28, and still permit accurate communications on the bus. This ground offset insensitivity exists because the parabolic current from the generator 100 is converted by the capacitor 30 into a voltage and imposed onto the node BUS. Since the current to voltage conversion accomplished by the capacitor 30 controls only the rate of change of the voltage, and is insensitive to the value of the starting voltage, the voltage shaping can occur from whatever the starting voltage is on BUS GROUND.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected. For example, the current and voltage values described herein are illustrative of a preferred embodiment of the present invention and should not be considered to be limiting. Those skilled in the art will recognize that the parabolic current generator 100 and communication bus driver may be designed using various current and voltage values to suit particular applications.

What is claimed is:

1. A current generator comprising:

an operational amplifier having an inverting input, a non-inverting input and an output;

a first field effect transistor having a gate, a drain and a source, said gate and said drain of said first transistor being connected to said inverting input and to a source of alternatingly high and low input current, said drain and said source of said first transistor defining an impedance therebetween, said first transistor establishing a voltage level at said inverting input proportional to the flow of current from said input current source through said impedance; and a capacitor connected between said non-inverting input and said output;

wherein said capacitor has a value inversely proportional to a difference in voltage levels at said inverting input corresponding to the difference between said high and low input currents flowing through said impedance;

and wherein said impedance is sized to maximize said difference in voltage levels at said inverting input to thereby minimize said capacitor value.

2. The current generator of claim 1 further including:

a second field effect transistor having a gate, a drain and a source, said gate of said second transistor being connected to said non-inverting input, said drain being connected to a current supply;

wherein said operational amplifier is responsive to a high level voltage at said inverting input to produce a linearly increasing voltage at said non-inverting input, and to a low level voltage at said inverting input to produce a linearly decreasing voltage at said non-inverting input;

and wherein said second transistor is responsive to said linearly increasing voltage at said gate to draw a parabolically increasing current from said current supply, and to said linearly decreasing voltage at said gate to draw a parabolically decreasing current from said current supply.

3. A current generator comprising:

a first circuit responsive to a high input current to provide a linearly increasing voltage, and to a low input current to provide a linearly decreasing voltage;

a second circuit responsive to said linearly increasing voltage to provide a parabolically increasing output current, and to said linearly decreasing voltage to provide a parabolically decreasing output current;

whereby said current generator is responsive to said high input current to produce a parabolically increasing output current, and to said low input current to produce a parabolically decreasing output current.

4. The current generator of claim 3 wherein said first circuit includes:

a field effect transistor having an impedance associated therewith, said transistor receiving said high and low input current and producing correspondingly high and low voltage drops across said impedance; and an operational amplifier having an inverting input connected to said transistor, a non-inverting input and an output; and a capacitor connected between said non-inverting input and said output;

and wherein said operational amplifier provides said linearly increasing and decreasing voltages at said non-inverting input in response to said high and low voltage drops respectively at said inverting input.

5. The current generator of claim 4 wherein the size of said capacitor is inversely proportional to the difference between said high and low level voltage drops at said inverting input;

and wherein said impedance of said transistor is sized to maximize said difference between said high and low level voltage drops at said inverting input to thereby minimize said capacitor size.

6. The current generator of claim 5 wherein said transistor includes a gate, a drain and a source, said gate and drain being connected to said inverting input, and said drain and source defining said impedance therebetween.

7. The current generator of claim 3 wherein said second circuit includes:

a field effect transistor having a gate, a drain and a source; and a current supply connected to said drain;

and wherein said transistor is responsive to said increasing and decreasing voltages at said gate to thereby cause said transistor to draw said corresponding parabolically increasing and decreasing currents from said current supply into said drain.

* * * * *